United States Patent
Jeong

(10) Patent No.: US 9,287,395 B2
(45) Date of Patent: Mar. 15, 2016

(54) SEMICONDUCTOR DEVICE AND A BIT LINE AND THE WHOLE OF A BIT LINE CONTACT PLUG HAVING A VERTICALLY UNIFORM PROFILE

(71) Applicant: SK HYNIX INC., Icheon (KR)

(72) Inventor: Mun Mo Jeong, Seoul (KR)

(73) Assignee: SK HYNIX INC., Icheon (KR)

(*) Notice: Subject to any disclaimer, the term of this patent is extended or adjusted under 35 U.S.C. 154(b) by 0 days.

(21) Appl. No.: 14/022,163

(22) Filed: Sep. 9, 2013

(65) Prior Publication Data

US 2014/0008719 A1  Jan. 9, 2014

Related U.S. Application Data

(62) Division of application No. 12/840,163, filed on Jul. 20, 2010, now abandoned.

(30) Foreign Application Priority Data

Jul. 15, 2010 (KR) .................... 10-2010-0068369

(51) Int. Cl.
  *H01L 27/108* (2006.01)
  *H01L 29/78* (2006.01)
  *H01L 21/768* (2006.01)
  *G11C 16/04* (2006.01)
  *H01L 29/66* (2006.01)

(52) U.S. Cl.
  CPC ........ *H01L 29/7827* (2013.01); *G11C 16/0466* (2013.01); *H01L 21/76877* (2013.01); *H01L 21/76897* (2013.01); *H01L 27/10823* (2013.01); *H01L 27/10885* (2013.01); *H01L 27/10888* (2013.01); *H01L 29/66704* (2013.01)

(58) Field of Classification Search
  CPC ................... H01L 21/76897; H01L 21/76877; H01L 27/10885; H01L 27/10888; H01L 29/66704
  USPC .......... 257/301, 330, 332, E21.158, E21.585; 438/259
  See application file for complete search history.

(56) References Cited

U.S. PATENT DOCUMENTS

| | | | |
|---|---|---|---|
| 6,576,509 B1* | 6/2003 | Toyokawa et al. | 438/253 |
| 2002/0008324 A1 | 1/2002 | Shinkawata | |
| 2003/0160273 A1 | 8/2003 | Hieda | |
| 2005/0090054 A1 | 4/2005 | Kim | |
| 2007/0075336 A1* | 4/2007 | Sel et al. | 257/202 |
| 2007/0152255 A1* | 7/2007 | Seo | H01L 27/0207 257/302 |
| 2007/0178641 A1* | 8/2007 | Kim et al. | 438/243 |
| 2008/0048253 A1* | 2/2008 | Sun | H01L 27/105 257/330 |

(Continued)

FOREIGN PATENT DOCUMENTS

| | | |
|---|---|---|
| CN | 1610094 A | 4/2005 |
| JP | 2002-043544 A | 2/2002 |

(Continued)

*Primary Examiner* — Eduardo A Rodela
*Assistant Examiner* — Christopher M Roland

(57) ABSTRACT

A semiconductor device comprises: a semiconductor substrate including a cell region and a peripheral region; an insulating film formed on the top portion of the semiconductor substrate of the cell region; a bit line contact hole including the etched insulating film to expose the semiconductor substrate; a bit line contact plug buried in the bit line contact plug; and a bit line formed on the top portion of the bit line contact plug to have the same width as that of the bit line contact plug. The thickness of the insulating film around a cell bit line is minimized so as to vertically form a profile of the cell bit line, thereby improving an overlay margin of a storage node contact and an active region.

12 Claims, 10 Drawing Sheets

(56) References Cited

U.S. PATENT DOCUMENTS

2008/0061340 A1  3/2008  Heineck et al.
2008/0284029 A1* 11/2008  Kim et al. .................... 257/758
2011/0175229 A1*  7/2011  Kim .................. H01L 21/76897
                                                        257/773
2013/0119448 A1*  5/2013  Lee ................... H01L 27/10823
                                                        257/296

FOREIGN PATENT DOCUMENTS

| KR | 10-2000-0013720 A | 3/2000 |
| KR | 10-2001-0021337 A | 3/2001 |
| KR | 10-2008-0030385 A | 4/2008 |
| KR | 10-2009-0074541 A | 7/2009 |
| TW | 200814298 A | 3/2008 |

* cited by examiner

SEMICONDUCTOR DEVICE AND A BIT LINE AND THE WHOLE OF A BIT LINE CONTACT PLUG HAVING A VERTICALLY UNIFORM PROFILE

CROSS-REFERENCE TO RELATED APPLICATION

The present application is a divisional of U.S. patent application Ser. No. 12/840,163 filed on Jul. 20, 2010, which claims priority to Korean Patent Application No. 10-2010-0068369 filed on Jul. 15, 2010, the disclosure of which are hereby incorporated in their entirety by reference.

BACKGROUND OF THE INVENTION

Embodiments of the present invention relate to a semiconductor device and a method for manufacturing the same, and more specifically, to a semiconductor device including a buried-type gate.

A semiconductor memory device comprises a plurality of unit cells, each including one capacitor and one transistor. The capacitor is used to temporarily store data, and the transistor is used to transfer data between a bit line and the capacitor according to a control signal (word is line) using the characteristics of a semiconductor to change the electrical conductivity according to an environment. The transistor is composed of three regions including a gate, a source, and a drain. Charge transfer occurs between the source and the drain according to a control signal input to the gate. The charge transfer between the source and the drain is achieved through a channel region using the characteristics of the semiconductor.

In a semiconductor device a transistor is disposed on a semiconductor substrate. After a gate is formed on the semiconductor substrate, impurities are doped on both sides of the gate to form a source and a drain. In this case, a space between the source and the drain under the gate becomes a channel region of the transistor. The transistor having a horizontal channel region occupies a given area of the semiconductor substrate. In the case of a complicated semiconductor memory device, it is difficult to reduce the whole area due to a plurality of transistors included in the semiconductor memory device.

When the whole area of the semiconductor memory device is reduced, the number of semiconductor memory devices which can be produced per wafer may be increased to improve the productivity. In order to reduce the whole area of the semiconductor memory device, various methods have been suggested. Of these methods, a recess gate is used instead of a conventional planar gate having a horizontal channel region. A recess is formed in a substrate, and a gate is formed in the recess, thereby obtaining the recess gate including a channel region along the curved surface of the recess. Moreover, a buried gate obtained by burying the whole gate in the recess has been researched.

In the buried gate, the whole gate is buried below the surface of the semiconductor substrate, thereby securing the length and the width of the channel. Also, in comparison with the recess gate, the buried gate can reduce the parasitic capacitance generated between the gate (word line) and the bit line by 50%.

However, when the buried gate process is performed on the entire structure of a cell region and a peripheral region, a space (height) of the cell region remains relative to the height where the gate of the peripheral region is formed. As a result, it matters how this height difference is used. In the prior art, (i) a cell region space corresponding to the gate height is empty, or (ii) a bit line of the cell region is formed together when the gate of the peripheral region is formed (gate bit line; GBL).

However, (i) when the space of the cell region is empty, the height of the storage node contact plug becomes higher in the cell region. As a result, a storage node contact hole is required to be formed deep, thereby increasing the difficulty of forming a bit line. (ii) When the bit line of the cell region is formed along with the gate of the peripheral region (GBL), an electrode of the bit line of the cell region is formed of the same material which forms a gate electrode in the peripheral region. Thus, the bit line in the cell region contains a barrier metal layer as well. As a result, the height of the bit line becomes higher, thereby increasing the parasite capacitance of the cell region.

BRIEF SUMMARY OF THE INVENTION

Various embodiments of the invention are directed to minimizing the thickness of the insulating film around a cell bit line so as to vertically form a profile of the cell bit line, thereby improving an overlay margin of a storage node contact and an active region.

According to an embodiment of the present invention, a semiconductor device comprises: a semiconductor substrate including a cell region and a peripheral region; an insulating film formed on the top portion of the semiconductor substrate of the cell region; a bit line contact hole including the etched insulating film to expose the semiconductor substrate; a bit line contact plug buried in the bit line contact plug; and a bit line formed on the top portion of the bit line contact plug to have the same width as that of the bit line contact plug.

The insulating film includes an oxide film or a nitride film. The semiconductor device further comprises a spacer including an oxide film, a nitride film or a deposition structure including an oxide film and a nitride film formed at sidewalls of the bit line contact holes.

The insulating film has a thickness ranging from 50 Å to 100 Å.

The bit line includes: a metal layer formed on the top portion of the bit line contact plug; a bit line conductive layer formed on the top portion of the barrier metal layer; a hard mask layer formed on the top portion of the conductive layer; and a spacer formed at sidewalls of the barrier metal layer, the bit line conductive layer and the hard mask layer.

The semiconductor device further comprises a gate formed in the semiconductor substrate of the peripheral region, wherein the gate of the peripheral region has the same structure as that of the bit line of the cell region.

A polysilicon layer of the bit line of the cell region has a lower thickness than that of the polysilicon layer of the gate of the peripheral region, thereby reducing a contact resistance.

The semiconductor device further comprises a buried-type gate buried with a given depth in an active region and a device isolation film in the cell region of the semiconductor substrate. The buried-type gate includes: a recess formed with a given depth in the semiconductor substrate; a gate oxide film formed on the surface of the recess; a gate electrode disposed in the bottom portion of the recess including the gate oxide film; and a capping film disposed on the top portion of the gate electrode in the recess, thereby reducing a parasite capacitance with the bit line.

According to an embodiment of the present invention, a method for manufacturing a semiconductor device comprises: preparing a semiconductor substrate including a cell region and a peripheral region; forming an insulating film formed on the top portion of the semiconductor substrate of the cell region; etching the insulating film to form a bit line contact hole that exposes the semiconductor substrate; burying a bit line contact plug in the bit line contact hole; and forming a bit line on the top portion of the bit line contact plug to have the same width as that of the bit line contact plug. The method can minimize the thickness of the insulating film around a cell bit line so as to vertically form a profile of the cell bit line, thereby improving an overlay margin of a storage node contact and an active region.

After forming an insulating film, the method further comprises forming a first polysilicon layer on the top portion of the insulating film and on the top portion of the semiconductor substrate of the peripheral region. The bit line contact plug of the cell region is simultaneously formed with a gate polysilicon of the peripheral region.

The forming-a-bit-line-contact-hole further includes etching the first polysilicon layer disposed on the top portion of the insulating film. The bit line and the bit line contact plug are vertically formed.

Before burying a bit line contact plug in the bit line contact hole, the method further comprises forming a spacer including an oxide film, a nitride film or a deposition structure including an oxide film and a nitride film at sidewalls of the bit line contact hole.

The forming-a-bit-line includes forming a second polysilicon layer, and further includes removing a given thickness of the second polysilicon layer of the cell region, thereby reducing a resistance of the bit lien contact plug.

The insulating film includes an oxide film or a nitride film. The insulating film is formed to have a thickness ranging from 50 Å to 100 Å.

The forming-a-bit-line includes: forming a barrier metal layer on the top portion of the bit line contact plug; forming a bit line conductive is layer on the top portion of the barrier metal layer; forming a hard mask layer on the top portion of the conductive layer; and forming a spacer at sidewalls of the barrier metal layer, the bit line conductive layer and the hard mask layer.

After forming a bit line, the method further comprises: forming a storage node contact hole that exposes the semiconductor substrate; and etching the insulating film disposed on the side of the storage node contact hole to enlarge the bottom width of the storage node contact hole, thereby reducing a resistance of the storage node contact plug.

The method further comprises forming a gate in the peripheral region, wherein the forming-a-gate-in-the-peripheral-circuit-region is simultaneously performed with the forming-a-bit-line.

Before forming an insulating film on the top portion of the semiconductor substrate of the cell region, the method further comprises forming a buried-type gate in the semiconductor substrate of the cell region, thereby reducing a parasite capacitance between the bit line and the gate.

DESCRIPTION OF EMBODIMENTS

The present invention will be described in detail with reference to the attached drawings.

Figure 1:
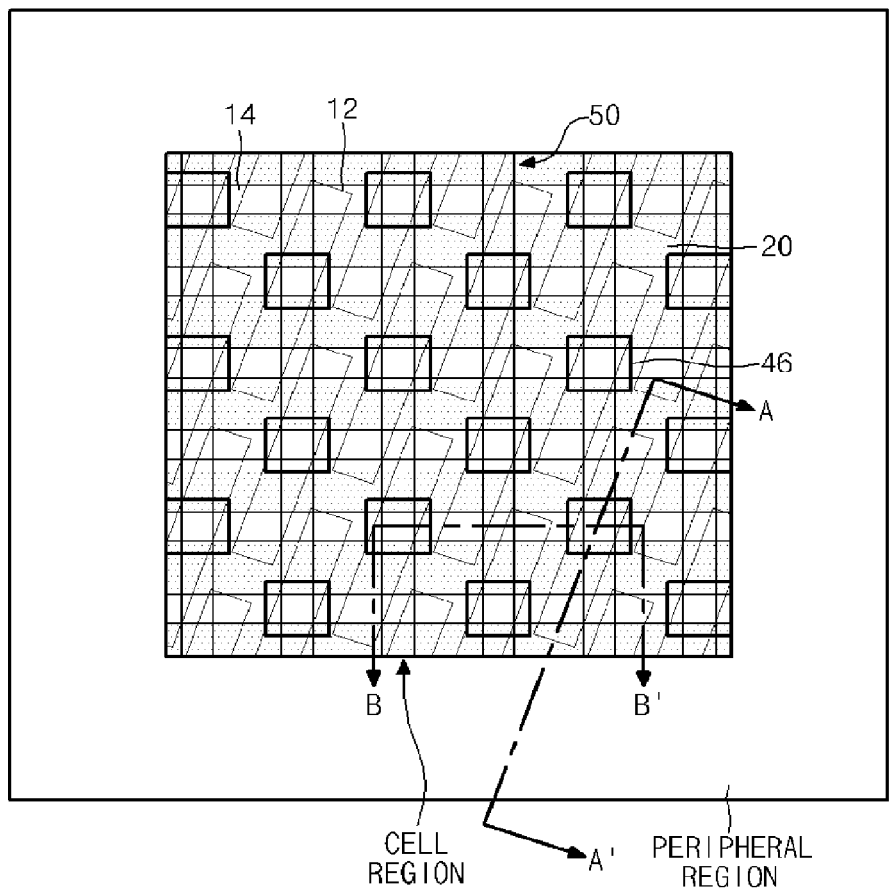
FIG. 1 is a plan view illustrating a cell region and a peripheral region of a semiconductor device according to an embodiment of the present invention.

FIG. 1 is a plan view illustrating a cell region and a peripheral region of a semiconductor device according to an embodiment of the present invention.

Referring to FIG. 1, a semiconductor substrate includes a cell region and a peripheral region. A device isolation film 14 that defines an active region 12 is disposed in the semiconductor substrate. In the cell region, a word line 20 is extended in a horizontal direction so that two word lines 20 (gate) may be running across one active region 12, and a bit line 50 is extended in a vertical direction so that one bit line 50 may be running across one active region 12. A bit line contact plug 46 for electrically coupling the active region 12 with the bit line 50 is formed at an intersection of the bit line 50 and the active region 12. Meanwhile, various elements including a transistor are formed in the peripheral region, but they are not shown in the specification and the drawings.

Figure 2A:
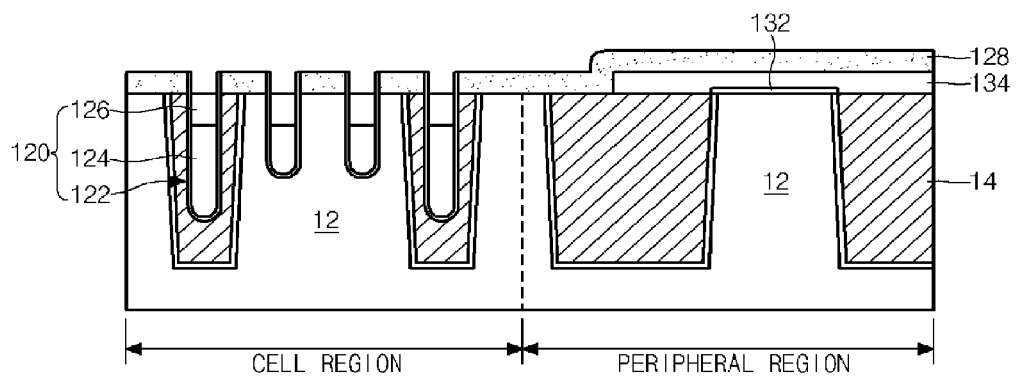
FIGS. 2a to 2e are cross-sectional diagrams illustrating a method for manufacturing a semiconductor device according to a conventional art.
Figure 2B:
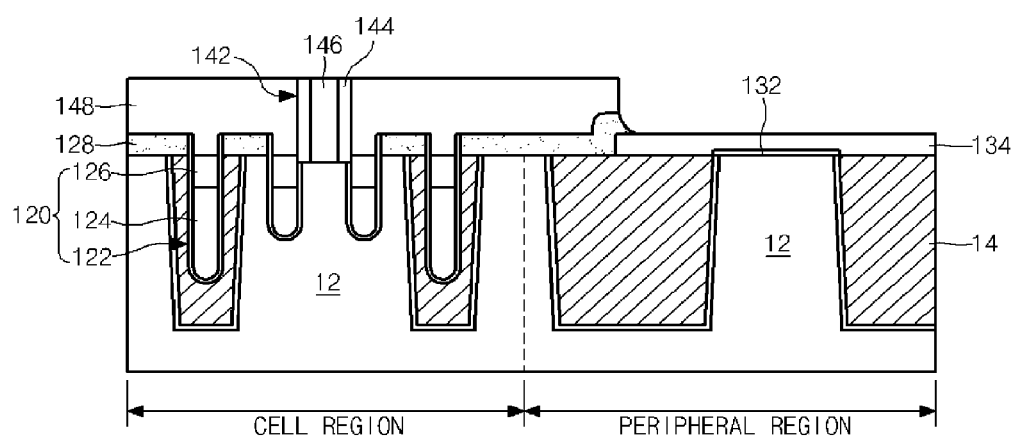
Figure 2C:
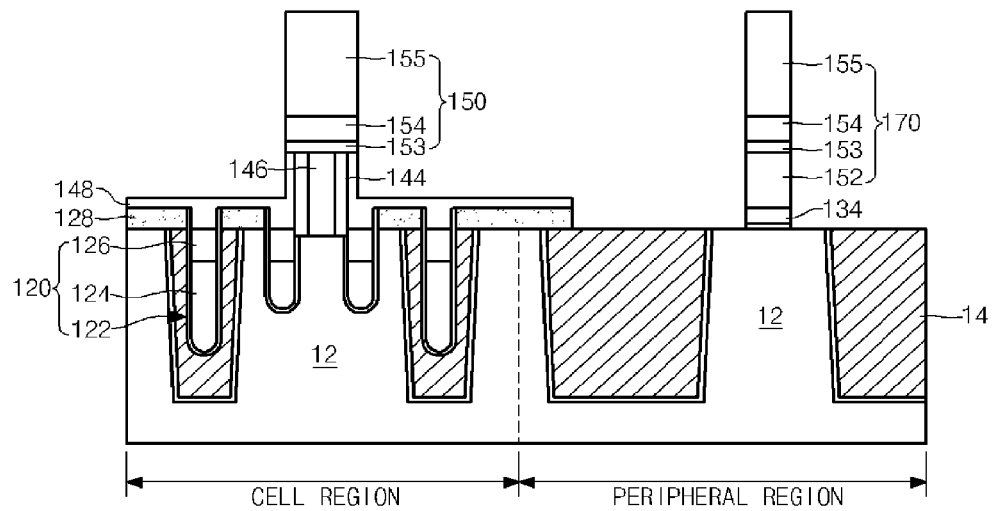
Figure 2D:
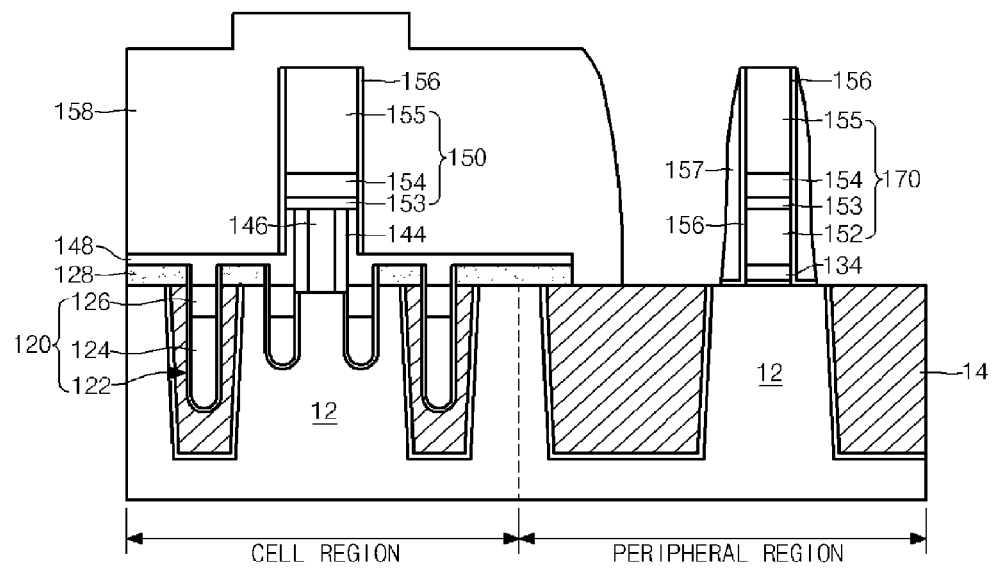
Figure 2E:
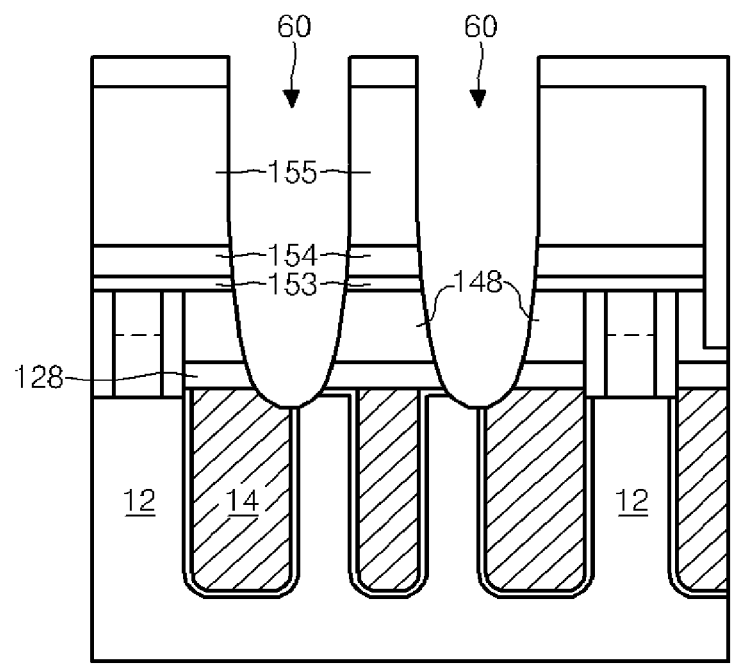

FIGS. 2a to 2e are cross-sectional diagrams illustrating a method for manufacturing a semiconductor device according to an embodiment of the present invention. FIGS. 2a to 2d are cross-sectional diagrams taken along A-A', and FIG. 2e is a cross-sectional diagram taken along B-B'.

Referring to FIG. 2a, the semiconductor substrate includes a cell region and a peripheral region. The device isolation film 14 that defines the active region 12 is disposed in the cell region and the peripheral region. A trench having a given depth is formed in the semiconductor substrate. A Shallow Trench Isolation (STI) process is formed to bury the trench with an insulating film such as an oxide film, thereby obtaining the device isolation film 14.

A buried-type gate 120 buried in the semiconductor substrate is disposed in the active region 12 and the device isolation film 14 of the cell region. The buried-type gate 120 includes a recess 122 formed with a given depth in the active region 12 and the device isolation film 14, a gate electrode 124 buried in the bottom portion of the recess 122, and a capping film 126 buried in the top portion of the gate electrode 124 in the recess 122. Since the buried-type gate 120 is buried in the bottom portion from the surface of the semiconductor substrate, the buried-type gate 120 can reduce a parasitic capacitance generated between the word line (gate) and the bit line.

A buried-type gate insulating film (or gate mask pattern) 128 shown in FIG. 2a is an insulating film that serves as a mask for forming the recess 122 of the buried-type gate 120. In a subsequent process, the buried-type gate insulating film 128 can have a structure to be easily etched in side-etching of the storage node contact hole, thereby increasing the bottom width of the contact hole. A gate oxide film 132 for forming a gate is formed in the active region 12 of the peripheral region. A first polysilicon layer 134 which is a part of a gate electrode in a subsequent process is formed with a given thickness on the top portion of the gate oxide film 132.

Referring to FIG. 2b, an interlayer dielectric film 148 including an oxide film is formed with a given thickness. A bit line contact hole 142 is formed in the interlayer dielectric film 148, and a bit line contact plug 146 is buried in the bit line contact hole 142. Before the bit line contact hole 142 is filled with the bit line contact plug 146, a bit line contact spacer 144 may be formed with a given thickness at sidewalls of the bit line contact hole 142. The bit line contact spacer 144 may include a nitride film. When the storage node contact hole is etched, the bit line contact spacer 144 serves as a buffer for protecting the bit line contact plug 146 when the storage node contact hole is etched. As shown in FIG. 2b, the interlayer dielectric film 148 and the buried-type gate insulating film 128 in the peripheral region are removed to expose the first polysilicon layer 134.

Referring to FIG. 2c, a second polysilicon layer 152 is formed in the peripheral region. A barrier metal layer 153, a conductive layer 154 and a hard mask layer 155 are deposited on the top portion of the bit line contact plug 146 of the cell region and the second polysilicon layer 152 of the peripheral region. The hard mask layer 155, the conductive layer 154, and the barrier metal layer 153 in both the cell region and the peripheral region, the second polysilicon layers 152 in the peripheral region, and the interlayer dielectric film 148 in the cell region are simultaneously etched to form a bit line 150 of the cell region and a gate 170 of the peripheral region.

Referring to FIG. 2d, spacer 156 is formed at sidewalls of the bit line 150 in the cell region and spacers 156 and 157 are formed at sidewalls of the gate 170 of the peripheral region, respectively. Then, an interlayer insulating film 158 is formed over the cell region including the bit line 150 in the cell region.

Referring to FIG. 2e, the interlayer insulating film 158 of the cell region is etched to form a storage node contact hole 60 that exposes the active region 12. While the storage node contact hole 60 is etched, a thick portion of the interlayer dielectric film 148 remains on the side surface of the bit line contact plug 146. Due to the thick residual interlayer dielectric film 148, the bottom width of the bit line 150 of the cell region is formed to be large so that the overlapped area of the storage node contact hole 60 and the active region 12 is small. As a result, when the storage node contact hole 60 is formed, the surface of the active region 12 is not exposed, or the bit line conductive layer 154 or the bit line contact plug 146 is exposed to generate an electric short with a storage node contact plug (not shown).

Figure 3A:
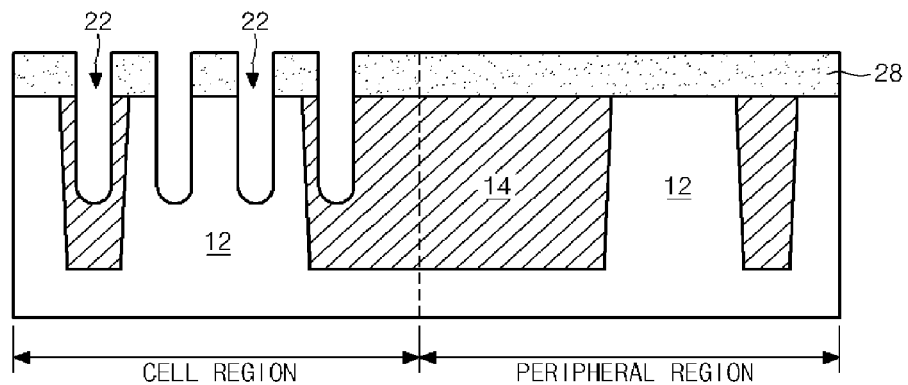
FIGS. 3a to 3l are cross-sectional diagrams illustrating a method for manufacturing a semiconductor device according to an embodiment of the present invention.
Figure 3B:
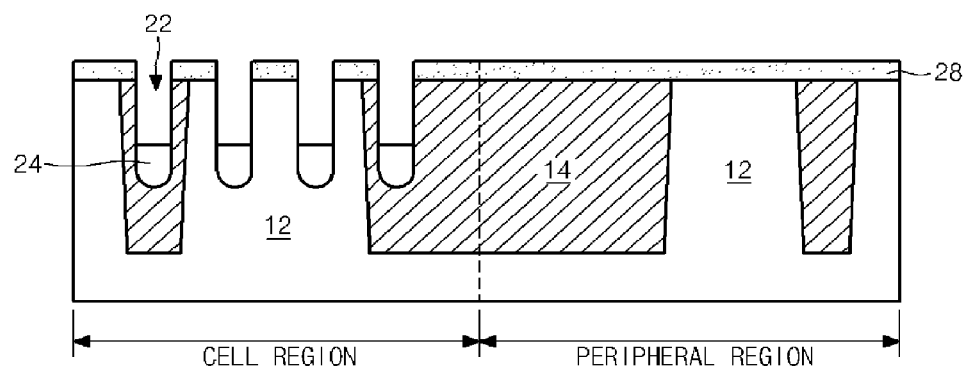
Figure 3C:
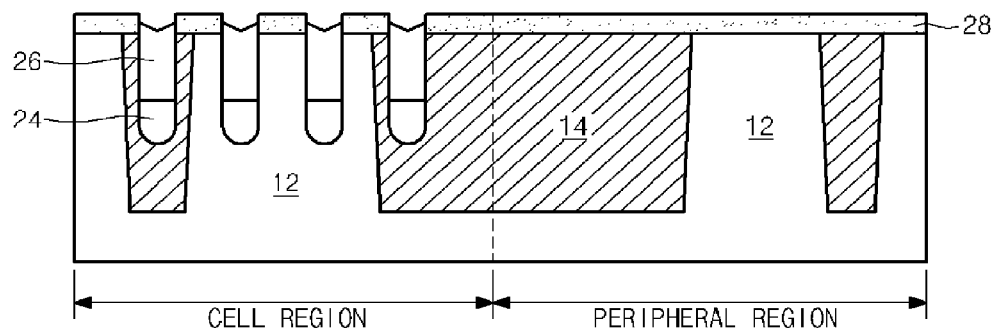
Figure 3D:
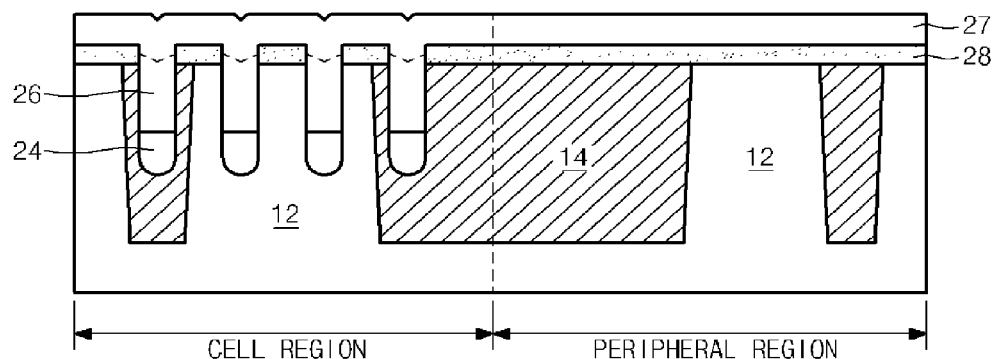
Figure 3E:
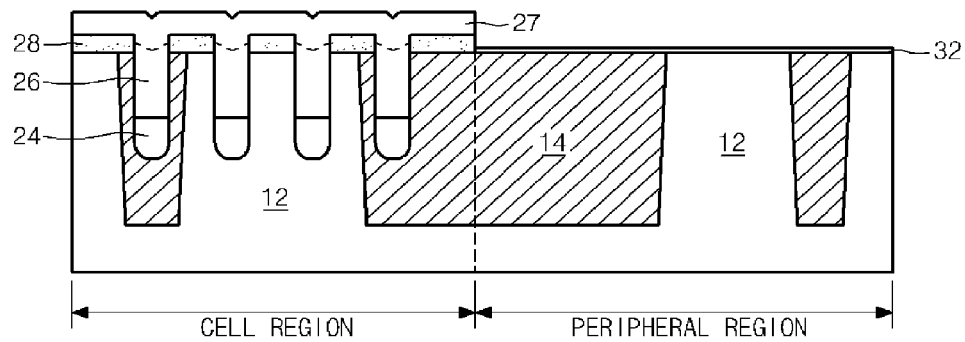
Figure 3F:
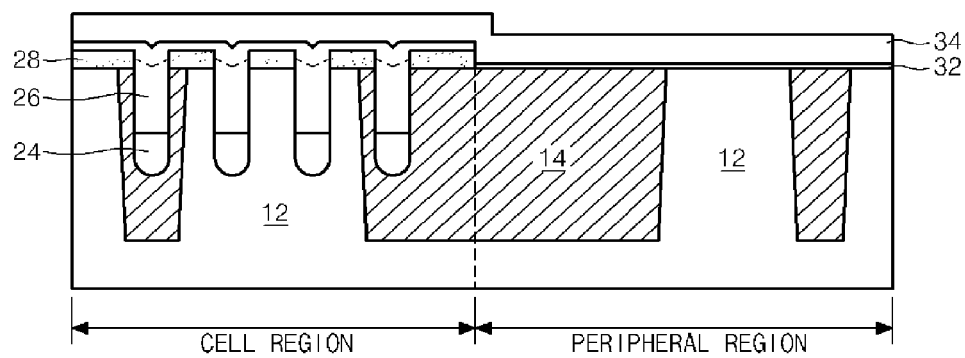
Figure 3G:
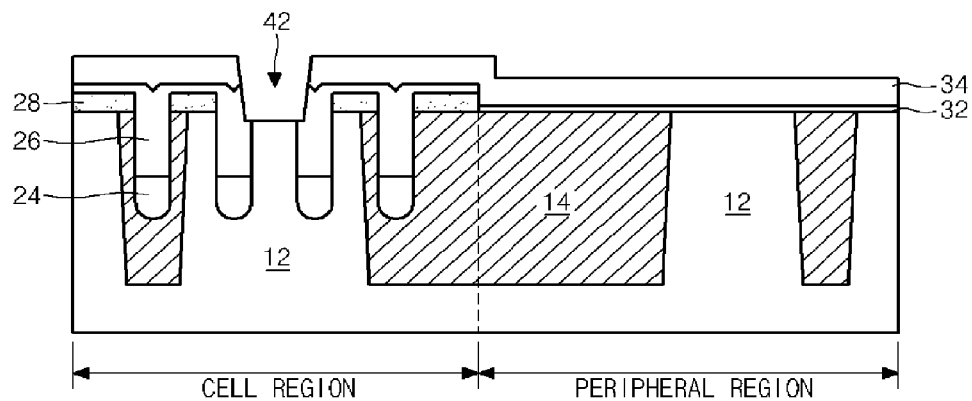
Figure 3H:
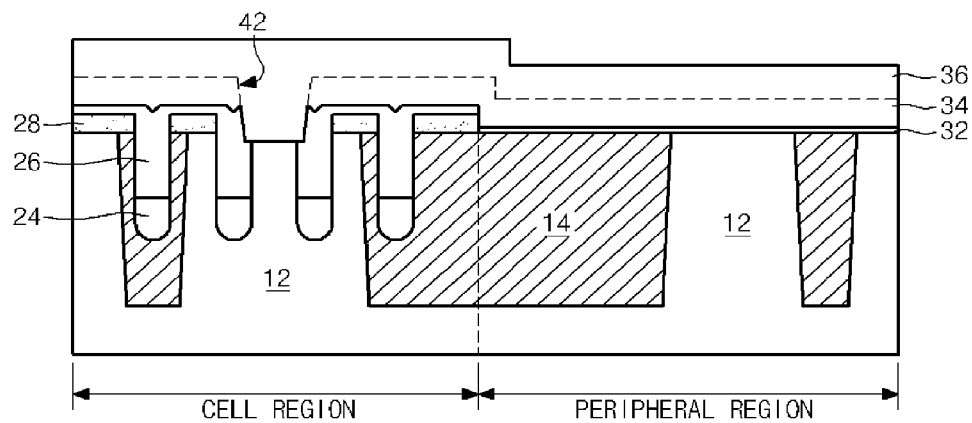
Figure 3I:
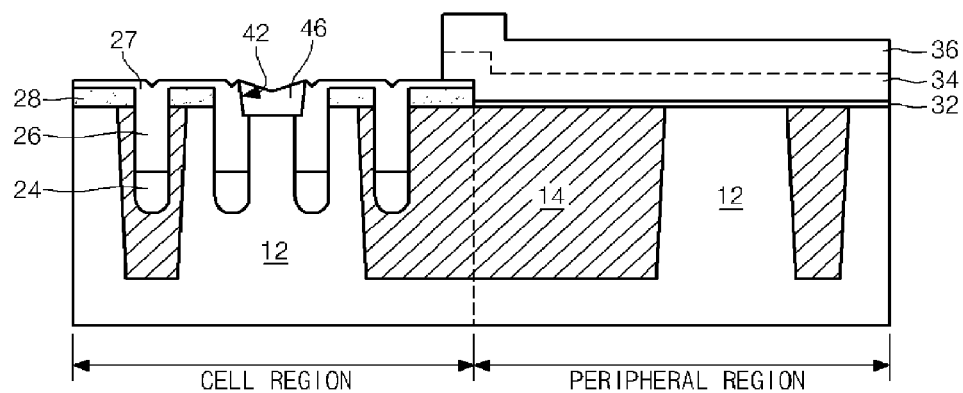
Figure 3J:
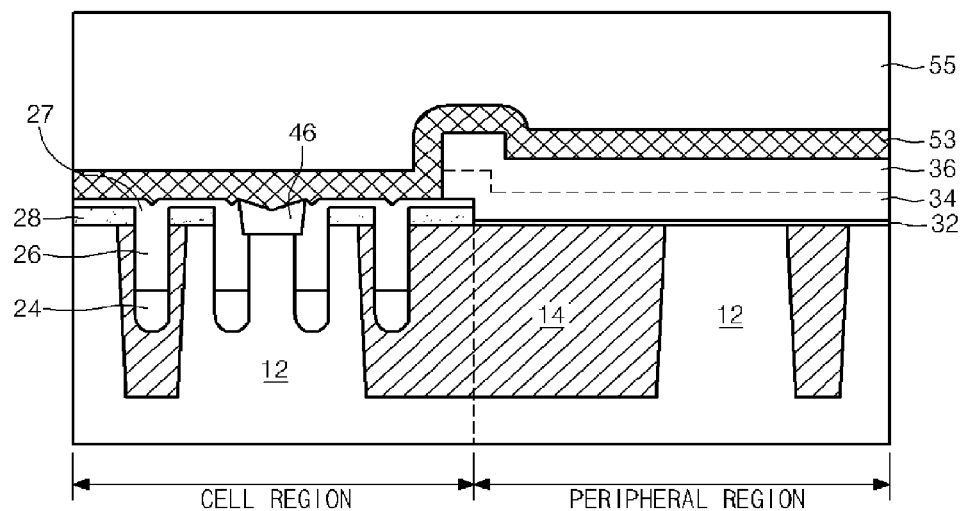
Figure 3K:
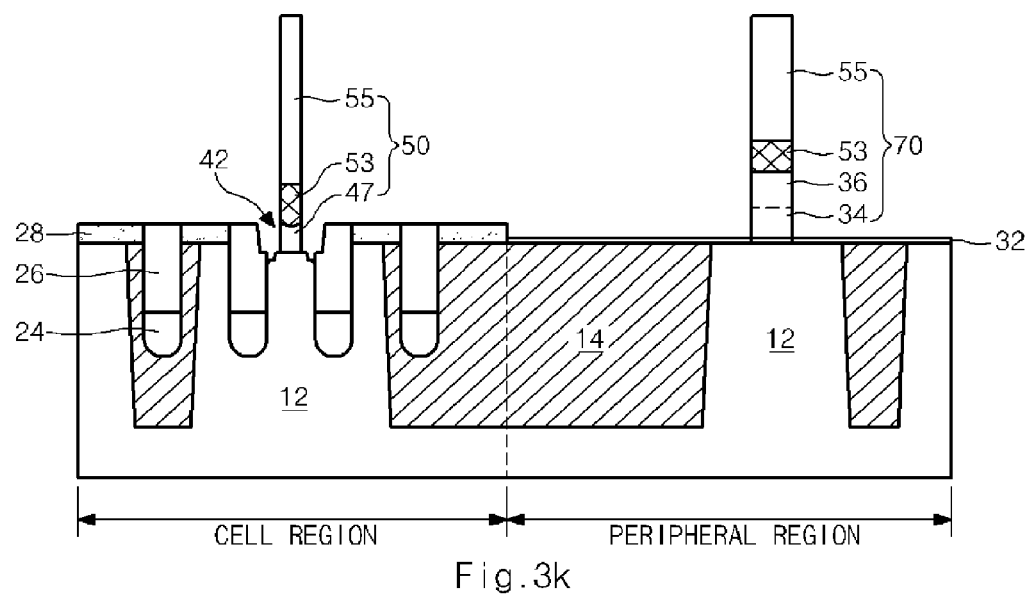
Figure 3L:
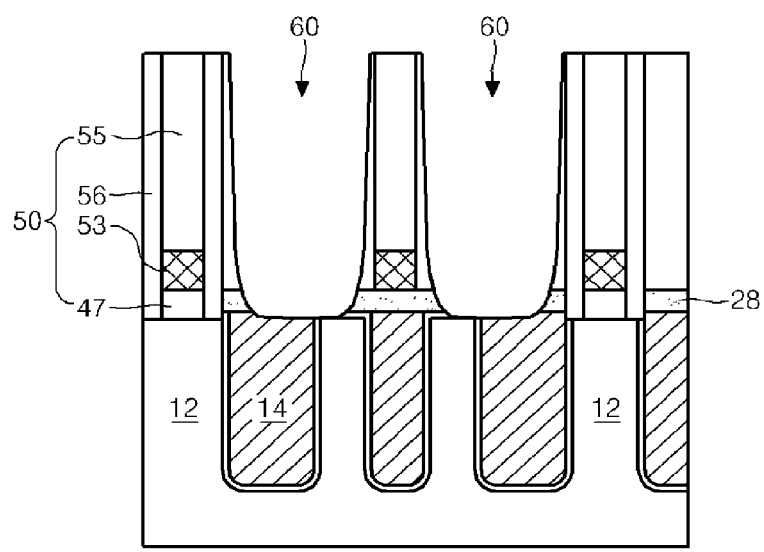

FIGS. 3a to 3l are cross-sectional diagrams illustrating a method for manufacturing a semiconductor device according to an embodiment of the present invention. FIGS. 3a to 3k are cross-sectional diagrams taken along A-A', and FIG. 3l is a cross-sectional diagram taken along B-B'. Among other benefits, the embodiment shown in FIGS. 3a to 3l allows a is residual interlayer dielectric film, e.g., a film such as the interlayer dielectric film 148, to have relatively small thickness.

Referring to FIG. 3a, a device isolation film 14 that defines an active region 12 is formed in a semiconductor substrate including a cell region and a peripheral region. A buried-type gate insulating film pattern (or gate mask pattern) 28 is formed with a given thickness on the surface of the semiconductor substrate. The gate mask pattern 28 is used to define a trench wherein a buried-type gate is to be formed. In an embodiment, the active region 12 and the device isolation film 14 of the cell region are etched with the gate mask pattern 28 as a mask to form a recess 22 with a given depth in the cell region. The gate mask pattern 28 includes an oxide film or a nitride film. Although it is not shown, a gate oxide film is formed on the surface of the recess 22.

Referring to FIG. 3b, a gate electrode 24 is formed in the recess 22 of the cell region. The gate electrode 24 includes tungsten (W). After a tungsten layer is deposited on the entire surface of the semiconductor substrate including the recess 22, a Chemical Mechanical Polishing (CMP) process is performed on the resultant structure. An etch-back process is performed to form a tungsten pattern in the bottom portion of the recess 22. The tungsten pattern serves as the gate electrode 24. During the CMP process, a part of the gate mask pattern 28 is removed by a given thickness (about 200 Å).

Referring to FIG. 3c, a capping layer 26 is formed over the gate electrode 24 to fill the recess 22. The capping film 26 which includes a is nitride film is formed to have a thickness of about 800 Å so as to protect the gate electrode 24. In an embodiment, in order to form the capping film 26, a nitride film is deposited on the semiconductor substrate including the recess 22, and removed by an etch-back process while leaving the nitride film in the recess 22.

Referring to FIG. 3d, a sealing layer 27 is formed on the entire surface of the semiconductor substrate including the capping film 26. The sealing film 27 which includes a nitride film is formed to have a thickness of about 350 Å.

Referring to FIG. 3e, the sealing film 27 and the insulating film in the peripheral region are etched away using an open mask (not shown) defining the peripheral region. The sealing film 27 remains over the cell region. An ion-implanting process for forming a transistor is performed on the active region 12 in the peripheral region. A gate oxide film 32 is formed on the surface of the semiconductor substrate of the peripheral region.

Referring to FIG. 3f, a first conductive layer (a first polysilicon layer) 34 is formed to have a thickness of about 250 Å in the cell region and the peripheral region. The first polysilicon layer 34 forms a gate in the peripheral region in a subsequent process. In an embodiment, the first conductive layer includes a polysilicon layer and is referred to herein as "the first polysilicon layer" for illustrative convenience.

Referring to FIG. 3g, a bit line contact hole 42 that exposes the active region 12 at a first side of the gate 20 in the cell region is formed. Specifically, in the process for forming the bit line contact hole 42, a mask (not shown) that defines the bit line contact hole 42 region is formed over the first polysilicon layer 34, and the first polysilicon layer 34, the sealing film 27 and the insulating film 28 are sequentially etched using the mask. An ion-implanting process is performed on the active region 12 exposed by the bit line contact hole 42 to form a junction.

Although it is not shown, before a plug material is buried in the bit line contact hole 42, a spacer is formed at sidewalls of the bit line contact hole 42 as shown in FIG. 2b so as to protect a contact plug. The spacer material may be formed of an oxide film, a nitride film or a stack structure including an oxide film and a nitride film.

Referring to FIG. 3h, a second conductive layer (or a second polysilicon layer) 36 is deposited with a thickness of about 600 Å on the entire surface of the semiconductor substrate including the bit line contact hole 42. In an embodiment, the second conductive layer 36 is a polysilicon layer and is referred to herein as "the second polysilicon layer" for illustrative convenience. While The second polysilicon layer 36 forms a contact plug in the cell region by filling the bit line contact hole 42, and at the same time forms a part of a peri-gate pattern along with the first polysilicon layer 34 in the peripheral region.

Referring to FIG. 3i, using a mask (not shown) that opens only the cell region, an etch-back process is performed onto the first and the second polysilicon layers 34 and 36 in the cell region so that a polysilicon pattern 46 remains in the bit line contact hole 42. In an embodiment, is the polysilicon pattern 46 is defined primarily within the bit line contact hole 42. The polysilicon pattern 46 is used to define a bit line contact plug in the cell region. During the etch-back process, a part of the sealing film 27 which includes a nitride film is removed by a thickness of about 100 Å and becomes thinner than before.

The etch-back process on the polysilicon layers 34 and 36 of the cell region can be adjusted if necessary. For example, an etch-back process can be performed such that the top level of the polysilicon pattern provided in the bit line contact plug in the cell region can be substantially the same height as the top level of the second polysilicon layer 36 forming a part of the peri-gate pattern in the peripheral region. As shown in FIG. 3i, when an etch-back process is performed so that the polysilicon layers 34 and 36 in the cell region is pattern to remain primarily in the contact hole 42 and thus define a recessed bit line contact plug, the top level of the bit line in the cell region is provided with a step difference from the top level of the peri-gate pattern in the peripheral region. In that case, however, the resistance of the bit line contact plug can be reduced since the total height of the bit line contact plug 46 is smaller.

Referring to FIG. 3j, a conductive layer 53 is deposited with a given thickness over the entire surface of the semiconductor substrate including the bit line contact plug, and a hard mask layer 55 is deposited thereon. The conductive layer 53 is used to define a bit line conductive layer in the cell region and a gate conductive layer in the peripheral region. The gate conductive layer forms a part of the peri-gate pattern. The conductive layer 53 includes a stack structure including a barrier metal and tungsten (W). The hard mask layer 55 includes a nitride film.

Referring to FIG. 3k, a mask (not shown) that defines a bit line in the cell region and the peri-gate pattern in the peripheral region is formed on the top portion of the hard mask layer 55. In the cell region, the hard mask layer 55, the conductive layer 53, the and the polysilicon pattern 46 are etched sequentially to form a bit line 50. The polysilicon pattern 46 is converted to a bit line contact plug 47 by the etching. In the peripheral region, the hard mask layer 55, the conductive layer 53, first and the second polysilicon layers 34 and 36 are sequentially etched to form the peri-gate pattern 70 In an embodiment, the cell region and the peripheral region are etched simultaneously. While the conductive layer 53 and the polysilicon pattern 46 are being etched in the cell region, the sealing film 27 in the cell region that includes a nitride film is removed as well. As a result, substantially no nitride film remains over a region in which a storage node contact hole will be formed.

Since the bit line 50 and the bit line contact plug 47 are formed in the same etch step in the cell region, the width of the cell bit line 50 is substantially the same as that of the bit line contact plug 47, thereby forming a vertically uniform profile. The thickness of the insulating film 28 formed over a region in which the storage node contact hole will be formed is thin enough to secure a sufficient overlay margin for forming a storage node contact hole in a subsequent process.

Referring to FIG. 3l, a spacer 56 that includes a nitride film or an oxide film is formed at sidewalls of the bit line pattern 50 in the cell region and the peri-gate pattern 70 in the peripheral region, and an interlayer dielectric film is formed over the bit line pattern 50 in the cell region and over the peri-gate pattern 70 in the peripheral region.

The interlayer dielectric film (not shown) of the cell region is etched to form a storage node contact hole 60 that exposes the active region 12. In comparison with the embodiment shown in FIG. 2e, the profiles of the bit line 50 and the bit line contact plug 47 are vertically uniform, and the thickness of the insulating film used as the gate mask pattern 28 is relatively thin at the active region exposed by the storage node contact hole 60 compared to the interlayer dielectric layer 148 shown in FIG. 2e. Thus, a sufficient margin for forming the storage node contact hole 60 can be secured, i.e., the need for over etching is reduced since the insulating film 28 is relatively thin. As a result, when the contact hole 60 is etched, the likelihood of the active region 12 being accidentally exposed or a part of the bit line 50 being accidentally attacked can be minimized.

Although it is not shown, after the bit line contact hole 60 is formed as shown in FIG. 3l, the method according to an embodiment of the present invention can further comprise a process of etching a given width of the insulating film 28 that includes an oxide film which remains on a sidewall of the storage node contact hole 60 so as to enlarge the bottom width of the storage node contact hole 60. As a result, the is contact area between a storage node contact plug filling the storage node contact hole 60 and the active region increases, thereby reducing contact resistance. Even though FIG. 3i shows the polysilicon pattern 46 as being completely recessed, the polysilicon pattern 46 can be partly recessed and have a portion extending beyond the recess. In the case where the polysilicon pattern 46 is partly recessed, an interlayer dielectric layer may remain over the region reserved for the storage node contact hole 60 by such a thickness that would not hinder forming a storage node contact hole 60 exposing a sufficient area of the active region. In yet another embodiment, the polysilicon pattern 46 may be a conductive pattern including conductive material other than polysilicon.

As described above, the semiconductor device and the method for manufacturing the same according to an embodiment of the present invention can minimize the thickness of the insulating film formed over a region where a storage node contact hole will be formed, thereby ensuring a sufficient margin for electrically coupling the storage node contact with the active region. In addition, the first polysilicon layer 34 forming a part of the peri-gate in the peripheral region serves as a buffer layer for the bit line contact plug 46 in the peripheral region, thereby simplifying the manufacturing process.

The above embodiments of the present invention are illustrative and not limitative. Various alternatives and equivalents are possible. The invention is not limited by the type of deposition, etching polishing, and patterning steps describe herein. Nor is the invention limited to any is specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a semiconductor substrate including a cell region and a peripheral region;
   a mask pattern disposed over the semiconductor substrate;
   a bit line contact hole extending through the mask pattern to expose the semiconductor substrate in the cell region;
   a bit line contact plug disposed within the bit line contact hole and directly contacting the semiconductor substrate; and
   a bit line disposed over the bit line contact plug,
   wherein the bit line and the entire bit line contact plug have the same width such that the bit line and the bit line contact plug have a vertically uniform profile, and
   wherein the width of the entire bit line contact plug is smaller than a width of the bit line contact hole.

2. The semiconductor device according to claim 1, wherein the mask pattern is a gate mask pattern defining a recess, the gate mask pattern including oxide, nitride, or both.

3. The semiconductor device according to claim 1, further comprising a spacer provided at sidewalls of the bit line contact hole, the spacer including oxide, nitride, or both.

4. The semiconductor device according to claim 1, wherein the mask pattern has a thickness ranging from 50 Å to 100 Å.

5. The semiconductor device according to claim 1, wherein the bit line includes:

a first barrier metal layer disposed over the bit line contact plug;

a first bit line conductive layer disposed over the barrier metal layer;

a first hard mask layer disposed over the bit line conductive layer; and a first spacer disposed at sidewalls of a first stack structure including the first barrier metal layer, the first bit line conductive layer and the first hard mask layer.

6. The semiconductor device according to claim 5, further comprising a peri-gate pattern disposed over the semiconductor substrate in the peripheral region, wherein the peri-gate pattern in the peripheral region includes a second barrier metal layer, a second bit line conductive layer, a second hard mask layer, and a second spacer, wherein the second spacer is disposed at sidewalls of a second stack structure, and wherein the second stack structure includes the second barrier metal layer, the second bit line conductive layer, and the second hard mask layer.

7. The semiconductor device according to claim 1, further comprising a buried-type gate buried in a recess of the cell region of the semiconductor substrate.

8. The semiconductor device according to claim 7, wherein the buried-type gate comprises:

a gate oxide film disposed over an inner surface of the recess;

a gate electrode disposed over the gate oxide film and within the recess at a lower portion; and a capping film disposed over the gate electrode and filling the recess.

9. A semiconductor device comprising:

a substrate including a cell region and a peripheral region;

a buried cell gate pattern disposed in the substrate in the cell region;

a gate mask pattern disposed over the substrate in the cell region, the gate mask pattern defining the buried cell gate pattern;

a bit line contact hole extending through the gate mask pattern to expose the substrate in the cell region;

a bit line contact plug disposed within the bit line contact hole and directly contacting the substrate;

an upper bit line pattern disposed over the bit line contact plug; and a storage node contact plug formed through the gate mask pattern and electrically coupled to the substrate, wherein a top level of the bit line contact plug is no higher than a top level of the gate mask pattern in the cell region, wherein the entire bit line contact plug and the upper bit line pattern have the same width, and wherein the width of the entire bit line contact plug is smaller than a width of the bit line contact hole.

10. The semiconductor device according to claim 9, wherein a thickness of the gate mask pattern is in a range from 50 Å to 100 Å.

11. The semiconductor device according to claim 9, wherein the bit line contact plug extends into the substrate, the substrate being a semiconductor substrate.

12. The semiconductor device according to claim 9, further comprising a peri-gate pattern disposed over the substrate in the peripheral region, wherein the peri-gate pattern is formed simultaneously with the upper bit line pattern and the bit line contact plug by employing a Gate-Bit-Line (GBL) process.

* * * * *